US011362493B2

(12) United States Patent
Ikeda et al.

(10) Patent No.: US 11,362,493 B2
(45) Date of Patent: Jun. 14, 2022

(54) LOCKING STRUCTURE, ELECTRICAL CONNECTION BOX, AND WIRE HARNESS

(71) Applicant: Yazaki Corporation, Tokyo (JP)

(72) Inventors: Tatsuhiko Ikeda, Makinohara (JP); Takaaki Kakimi, Makinohara (JP); Tetsuya Kato, Makinohara (JP)

(73) Assignee: Yazaki Corporation, Tokyo (JP)

( * ) Notice: Subject to any disclaimer, the term of this patent is extended or adjusted under 35 U.S.C. 154(b) by 687 days.

(21) Appl. No.: 16/394,705

(22) Filed: Apr. 25, 2019

(65) Prior Publication Data
US 2019/0348824 A1     Nov. 14, 2019

(30) Foreign Application Priority Data

May 8, 2018   (JP) .............................. JP2018-089717

(51) Int. Cl.
| | | |
|---|---|---|
| *H02G 3/04* | (2006.01) | |
| *H01R 9/24* | (2006.01) | |
| *B60R 16/02* | (2006.01) | |
| *H01R 13/518* | (2006.01) | |
| *H05K 5/02* | (2006.01) | |
| *H02G 3/08* | (2006.01) | |

(52) U.S. Cl.
CPC ....... *H02G 3/0418* (2013.01); *B60R 16/0215* (2013.01); *H01R 9/2408* (2013.01); *H01R 13/518* (2013.01); *H02G 3/08* (2013.01); *H05K 5/0247* (2013.01)

(58) Field of Classification Search
None
See application file for complete search history.

(56) References Cited

U.S. PATENT DOCUMENTS

| | | | | |
|---|---|---|---|---|
| 6,159,022 A | * | 12/2000 | Tsai ..................... | H01R 13/518 |
| | | | | 439/76.1 |
| 7,413,479 B1 | * | 8/2008 | Volpone ............... | H01R 13/506 |
| | | | | 439/352 |
| 10,225,005 B1 | * | 3/2019 | Elberbaum ........ | H04B 10/2589 |

(Continued)

FOREIGN PATENT DOCUMENTS

| | | | | | |
|---|---|---|---|---|---|
| CN | 1144410 A | * | 3/1997 | .......... | H01R 13/518 |
| CN | 1622412 A | * | 6/2005 | ......... | B60R 16/0215 |

(Continued)

*Primary Examiner* — Timothy J. Dole
*Assistant Examiner* — Muhammed Azam
(74) *Attorney, Agent, or Firm* — Banner & Witcoff, Ltd.

(57) ABSTRACT

A locking structure includes: a locking protrusion and a locking arm. The locking arm includes a flexible arm main body and an engaging projection portion protruding from an outer surface of the arm main body. The locking protrusion includes a protrusion main body on which an arm guide surface, a protruding tip surface, and an engaging surface are disposed along the engagement direction, and a jig groove that is formed in the protrusion main body. The engaging projection portion is formed on the outer surface at a position away from an arm tip of the arm main body in the engagement direction. The protruding tip surface is longer than the arm tip in the engagement direction. The jig groove cuts out the protrusion main body in the engagement direction from the arm guide surface to the protruding tip surface.

6 Claims, 14 Drawing Sheets

(56) References Cited

U.S. PATENT DOCUMENTS

| | | | |
|---|---|---|---|
| 2012/0091154 A1* | 4/2012 | Satoh | H05K 5/0026 |
| | | | 220/660 |
| 2012/0321379 A1* | 12/2012 | Wang | F16B 5/0664 |
| | | | 403/321 |
| 2016/0242303 A1* | 8/2016 | Maebashi | B60R 16/0238 |
| 2017/0373480 A1* | 12/2017 | Matsumoto | H02G 3/105 |
| 2019/0344730 A1* | 11/2019 | Kakimi | H05K 5/0013 |
| 2019/0348824 A1* | 11/2019 | Ikeda | H01R 9/2408 |
| 2019/0379191 A1* | 12/2019 | Kawamura | H02G 3/16 |
| 2019/0379193 A1* | 12/2019 | Kawamura | H02G 3/14 |
| 2020/0119532 A1* | 4/2020 | Imaizumi | H05K 7/02 |

FOREIGN PATENT DOCUMENTS

| | | | | |
|---|---|---|---|---|
| CN | 101494365 A | * | 7/2009 | B60R 16/0222 |
| CN | 101931187 A | * | 12/2010 | B60R 16/0239 |
| CN | 102655723 A | * | 9/2012 | G06F 1/1613 |
| CN | 107009934 A | * | 8/2017 | B60N 2/06 |
| CN | 109219281 A | * | 1/2019 | |
| CN | 111064143 A | * | 4/2020 | B60R 16/0215 |
| ES | 2432174 T3 | * | 12/2013 | H01R 13/6272 |
| JP | H0814221 A | * | 1/1996 | |
| JP | 2575979 Y2 | * | 4/1998 | |
| JP | 2582779 Y2 | * | 7/1998 | |
| JP | 2004247055 A | * | 9/2004 | H01R 13/518 |
| JP | 3838269 B1 | * | 10/2006 | H01R 13/6271 |
| JP | 2010073376 A | * | 4/2010 | |
| JP | 3163947 U | * | 11/2010 | H01R 13/6272 |
| JP | 2014-155361 A | | 8/2014 | |
| JP | 2014155361 A | * | 8/2014 | |
| JP | 5978398 B2 | * | 8/2016 | H01R 13/502 |
| JP | 6044933 B2 | * | 12/2016 | |
| JP | 2019054094 A | * | 4/2019 | |
| JP | 2019198144 A | * | 11/2019 | B60R 16/0215 |
| JP | 2020036497 A | * | 3/2020 | B60R 16/0207 |
| KR | 200409204 Y1 | * | 2/2006 | |
| KR | 101289716 B1 | * | 7/2013 | |
| KR | 20170142076 A | * | 12/2017 | |
| WO | WO-2006115101 A2 | * | 11/2006 | H02G 3/086 |
| WO | WO-2007113932 A1 | * | 10/2007 | H02G 3/14 |
| WO | WO-2012046462 A1 | * | 4/2012 | B60R 16/0215 |
| WO | WO-2014192800 A1 | * | 12/2014 | H01R 13/502 |
| WO | WO-2017006495 A1 | * | 1/2017 | B60R 16/0215 |

* cited by examiner

LOCKING STRUCTURE, ELECTRICAL CONNECTION BOX, AND WIRE HARNESS

CROSS-REFERENCES TO RELATED APPLICATIONS

This application is based on and claims priority from Japanese Patent Application No. 2018-089717 filed on May 8, 2018, the entire contents of which are incorporated herein by reference.

FIELD

One or more embodiments of the present invention relate to a locking structure related to the engagement of a locking protrusion and a locking arm. Further, one or more embodiments of the present invention relate to an electrical connection box adopting this locking structure and a wire harness to be wired in an automobile, provided with the electrical connection box.

BACKGROUND

In FIG. 11, reference numeral 1 indicates a locking structure of the related art. A locking structure 1 is configured to include a locking protrusion 3 protruding from an article 2, and a locking arm 5 formed on another article 4 and engaged with the locking protrusion 3. The locking structure 1 is adopted as a structure for fixing another article 4 to the article 2. An arm guide surface 6, a protruding tip surface 7, and an engagement surface 8 are formed on the locking protrusion 3. The arm guide surface 6, the protruding tip surface 7, and the engaging surface 8 are disposed along an engagement direction K (see the arrow in FIG. 12) with the locking arm 5. On the other hand, a flexible arm main body 9 and an engaging projection portion 10 protruding from the outer surface of the arm main body 9 are formed on the locking arm 5. The engaging projection portion 10 is formed at the position where an arm tip 11 of the arm main body 9 is left. In other words, the engaging projection portion 10 is formed on the outer surface of the arm main body 9 at a position away from the arm tip 11 in the engagement direction. An engaged surface 12, a protruding tip surface 13, and a guided surface 14 are formed on the engaging projection portion 10.

Hereinafter, the operation of the locking structure 1 will be briefly described with reference to FIGS. 12 to 14. In FIG. 12, when the locking arm 5 is moved along the engagement direction K of the arrow with respect to the locking protrusion 3, the locking arm 5 abuts on the locking protrusion 3 and is bent by sliding. The locking arm 5 is bent until the locking arm 5 moves to the position illustrated in FIG. 13 along the engagement direction K and, after that, when the locking arm 5 goes over the locking protrusion 3, the locking arm 5 elastically returns to the original state thereof as illustrated in FIG. 14. At this time, the locking arm 5 is engaged with the locking protrusion 3.

In the case of trying to release the engaged state for some reason, the engaged state can be released if the locking arm 5 is moved in the bending direction. Specifically, since the arm tip 11 is longer downward than the protruding tip surface 7 of the locking protrusion 3 and a space 15 is formed between the arm tip 11 and the arm guide surface 6, it is possible to release the engaged state by inserting a dedicated jig (or minus screwdriver and the like) into this space 15 to push the arm tip 11 and then moving the locking arm 5 in the bending direction. JP-A-2014-155361 is an example of the related art.

SUMMARY

In the above related art, when vibration along the engagement direction K has been applied to the article 2 and the other article 4, for example, for many years, there is a concern that the engaging surface 8 of the locking protrusion 3 is gradually scraped off by hitting the engaged surface 12 of the engaging projection portion 10 of the locking arm 5. For this reason, it is difficult to maintain a stably engaged state. Therefore, in order to improve the durability of the locking protrusion 3, the inventors have considered thickening the locking protrusion 3 by making the locking protrusion longer downward in the drawing. However, since the space 15 is not generated due to such a thickened portion, it is difficult to release the engaged state.

In order to release the engaged state, it is conceivable to make the arm tip 11 of the arm main body 9 longer downward. However, when the locking arm 5 is bent, there is a problem that the lengthened arm tip 11 abuts against the wall of another article 4 and is not released.

One or more embodiments of the present invention have been made in view of the above circumstances, and an object thereof is to provide a locking structure capable of improving the durability of a locking protrusion and maintaining easiness of releasing the engagement. Further, another object is to provide an electrical connection box adopting the locking structure and a wire harness including the electrical connection box and wired in an automobile.

One or more embodiments of the present invention provide a locking structure including: a locking protrusion that protrudes from a first article; and a locking arm that is formed on a second article and configured to be engaged with the locking protrusion in an engagement direction, the second article being different from the first article, wherein the locking arm includes a flexible arm main body and an engaging projection portion protruding from an outer surface of the arm main body, wherein the locking protrusion includes a protrusion main body on which an arm guide surface, a protruding tip surface, and an engaging surface are disposed along the engagement direction, and a jig groove that is formed in the protrusion main body, wherein the engaging projection portion is formed on the outer surface at a position away from an arm tip of the arm main body in the engagement direction, wherein the protruding tip surface is longer than the arm tip in the engagement direction, and wherein the jig groove cuts out the protrusion main body in the engagement direction from the arm guide surface to the protruding tip surface.

With this configuration, since the protrusion main body of the locking protrusion has a thickened structure as compared with the structure of the related art, the durability can be improved by the thickened amount than the related art. Since the jig groove is formed in the protrusion main body, it is possible to release the engaged state by using the jig (or a minus screwdriver and the like), and it is possible to maintain easiness of releasing the engagement as in the related art even though the protrusion main body is thickened.

One or more embodiments of the present invention may provide the locking structure described above, wherein the jig groove has a groove bottom having at least one of an inclined surface and a curved surface for guiding a jig toward the arm tip.

With this configuration, it is possible to smoothly guide the jig, thereby improving workability at the time of releasing the engagement.

One or more embodiments of the present invention may provide the locking structure described above, wherein the jig groove is formed at a center position of the protrusion main body in a width direction.

With this configuration, even though vibration is applied to one article and the other article and the protrusion main body is scraped off, the protrusion main body is reliably engaged with the engaging projection portion of the locking arm at both end positions in the width direction, thereby contributing to maintaining a stably engaged state.

One or more embodiments of the present invention may provide the locking structure described above, wherein the engagement direction substantially coinciding with a vibration direction of the first article and the second article.

With this configuration, even though vibration is applied in a direction in which the protrusion main body is likely to be scraped off, the direction of vibration and the direction of thickening are the same, thereby improving the durability than in the related art.

One or more embodiments of the present invention provide an electrical connection box including: an electronic component block to which a plurality of electronic components are assembled; and a housing to which the electronic component block is assembled, wherein the electronic component block is engaged with the housing by the above-described locking structure.

With this configuration, it is possible to provide an electrical connection box capable of making better engagement between the electronic component block and the housing.

One or more embodiments of the present invention provide a wire harness wired including: the above-described electrical connection box provided at an end portion of the wire harness to be wired to an automobile.

With this configuration, it is possible to provide a better wire harness because the electrical connection box is provided therein.

According to the locking structure of one or more embodiments of the present invention, it is possible to improve the durability of the locking protrusion and to maintain the easiness of releasing the engagement. Further, according to the electrical connection box and wire harness of one or more embodiments of the present invention, it is possible to provide a better product.

DETAILED DESCRIPTION

A locking structure includes a locking protrusion protruding from a frame of an electrical connection box, and a locking arm formed on an electronic component block of the electrical connection box. The locking structure is a structure in which the locking arm is engaged with a locking protrusion. The locking arm includes a flexible arm main body and an engaging projection portion protruding from the outer surface of the arm main body. The locking protrusion includes a protrusion main body and a jig groove formed in the protrusion main body. The engaging projection portion is disposed and formed to correspond to the position where the arm tip of the arm main body is left. The protrusion main body is formed in a thickened portion in which the length of the protruding tip surface is longer than the length of the arm tip. The jig groove is formed in a groove portion that cuts out the protrusion main body from the arm guide surface of the protrusion main body to the protruding tip surface.

Example 1

Figure 1:
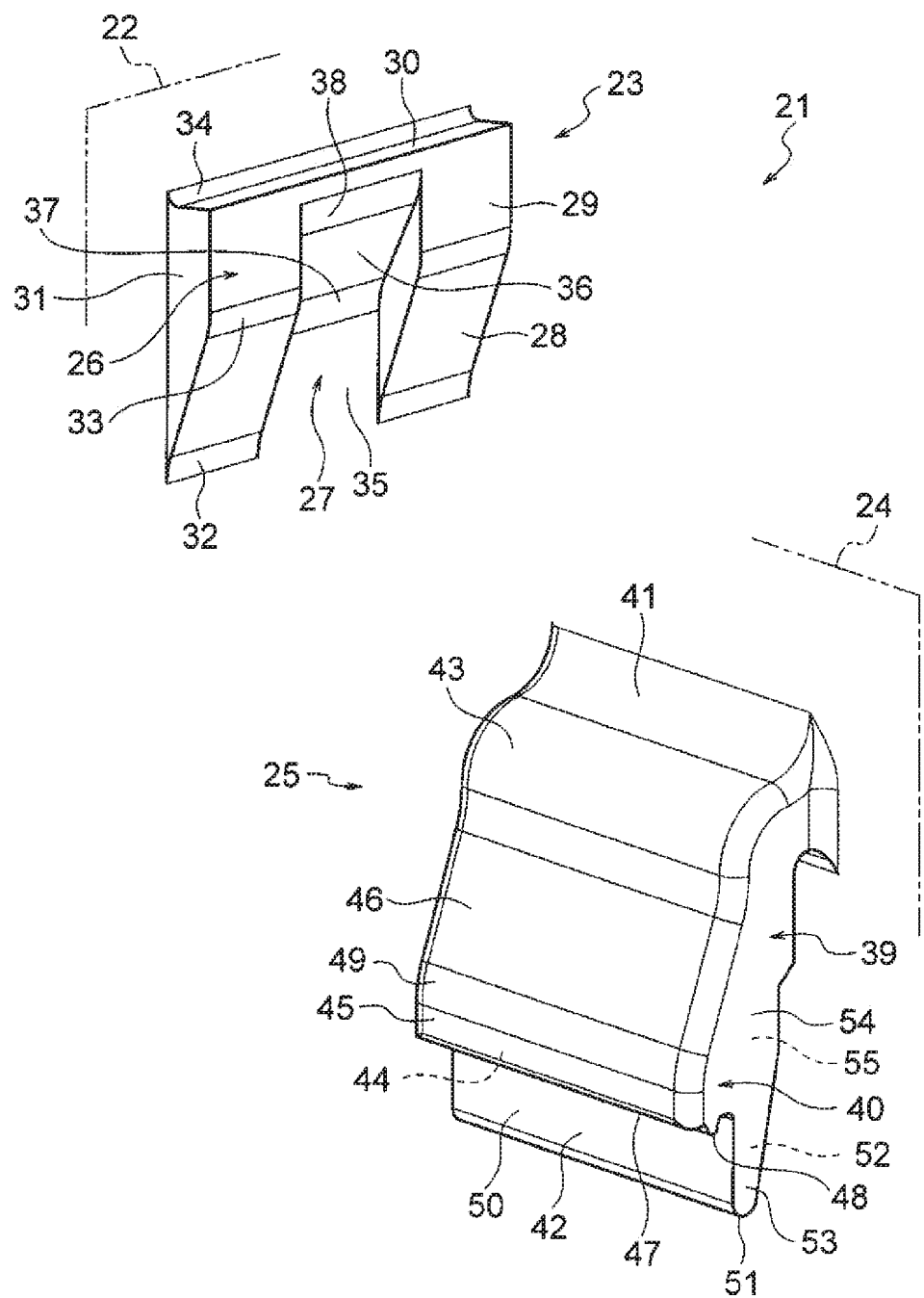
FIG. 1 is a configuration view illustrating a locking structure according to an embodiment of the present invention (Example 1)
Figure 2:
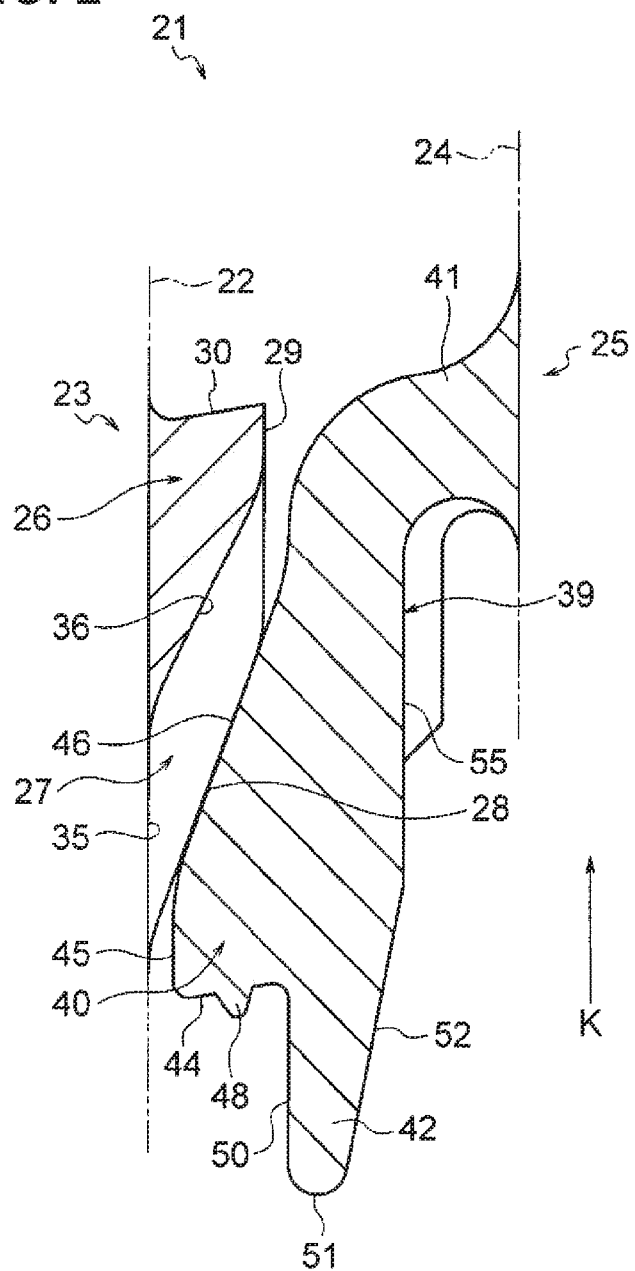
FIG. 2 is a cross-sectional view illustrating a state at the start of engagement.
Figure 3:
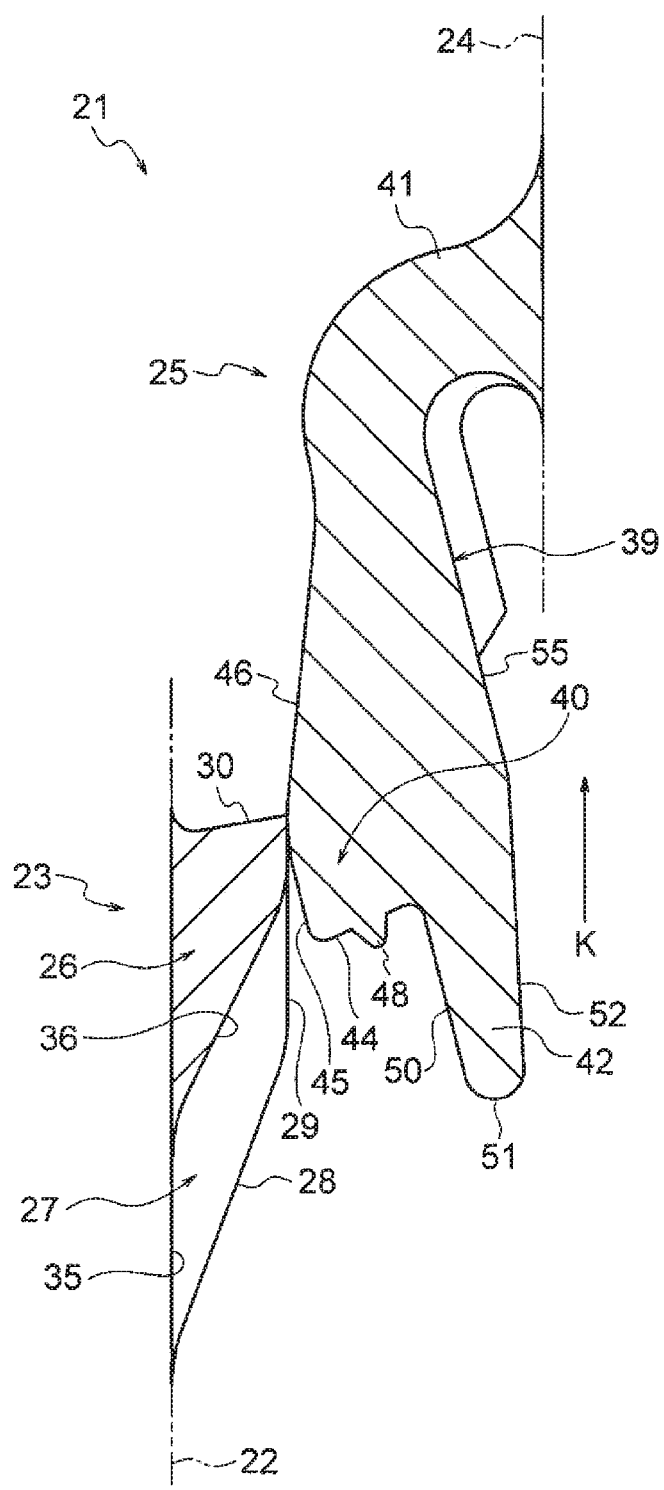
FIG. 3 is a cross-sectional view illustrating a state in the middle of engagement.
Figure 4:
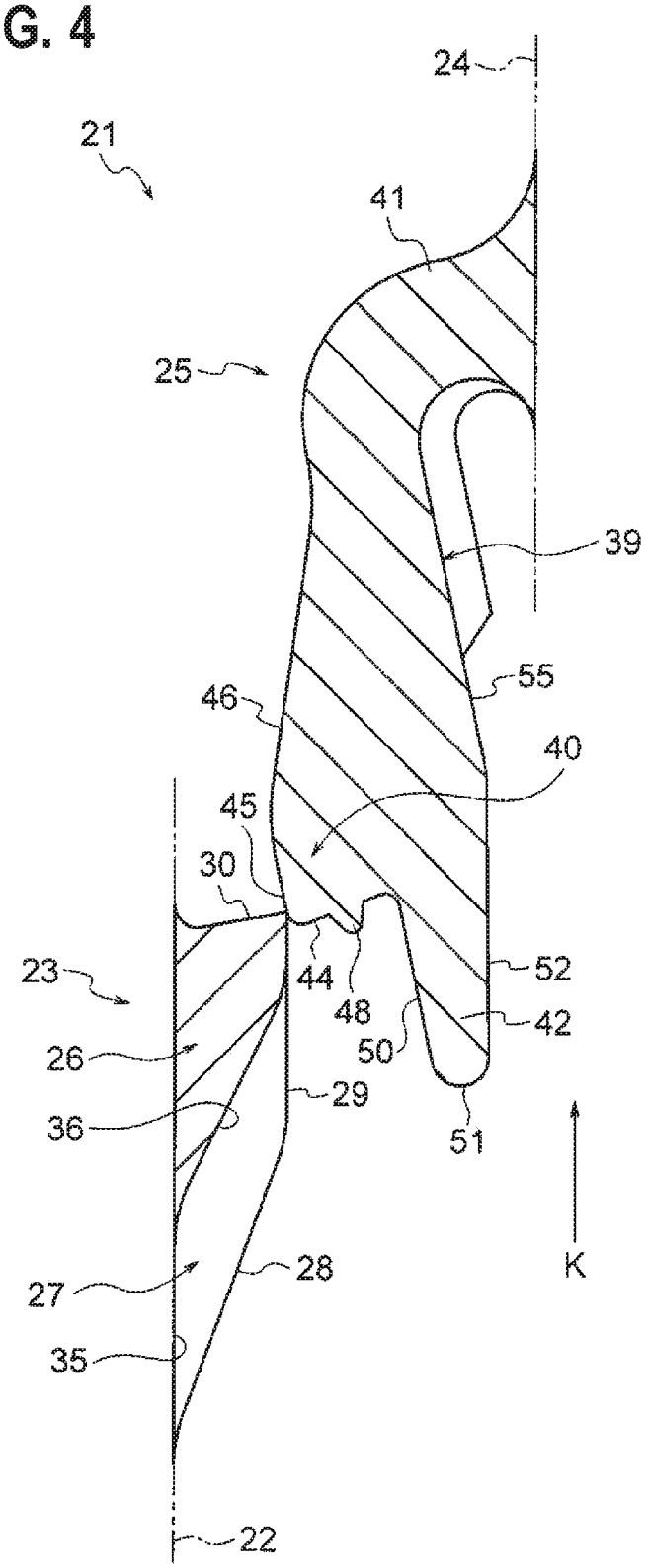
FIG. 4 is a cross-sectional view illustrating a state immediately before engagement.
Figure 5:
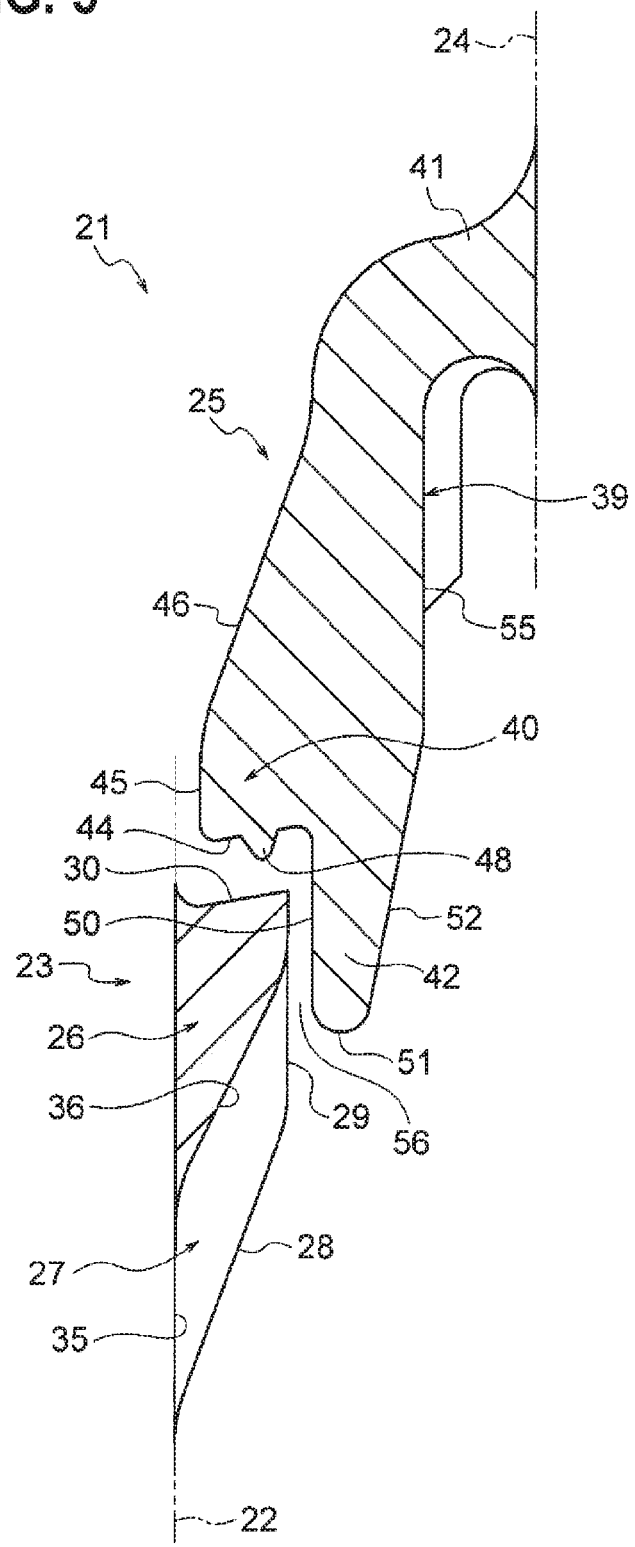
FIG. 5 is a cross-sectional view illustrating a state (engaged state) at the end of engagement.
Figure 6:
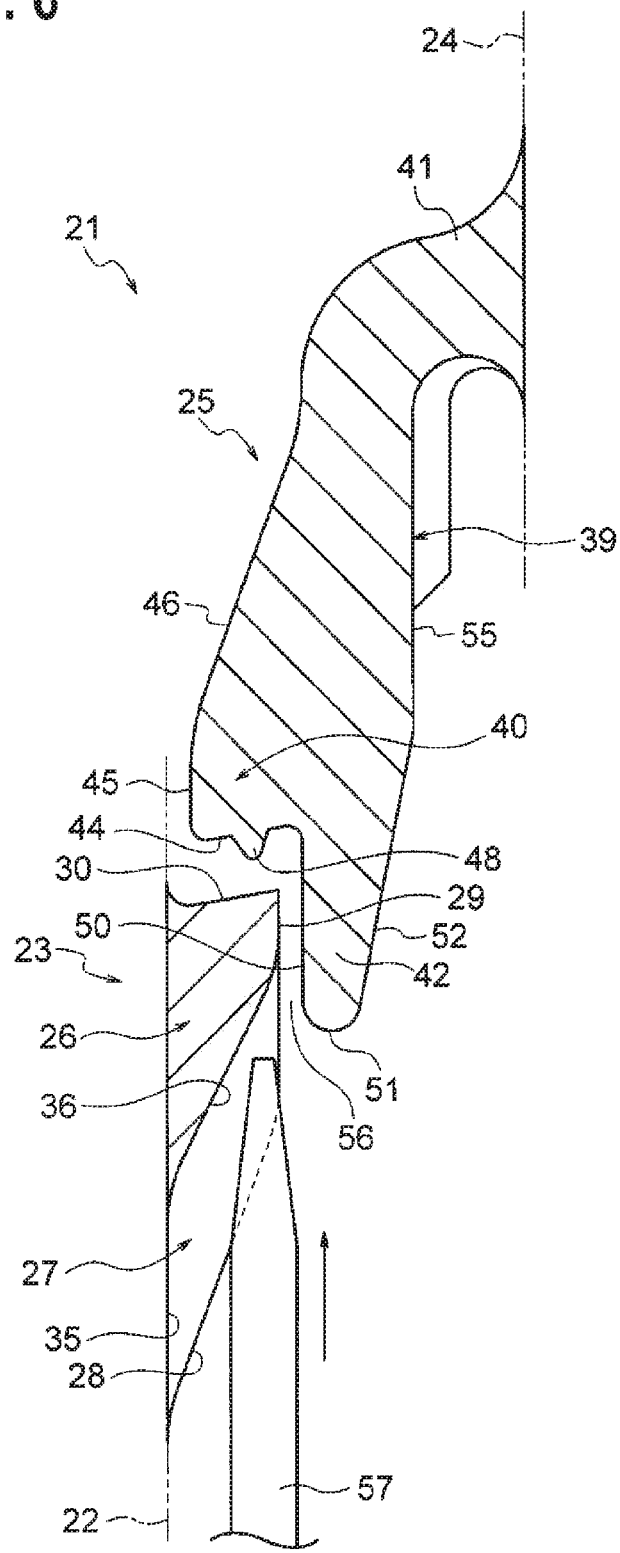
FIG. 6 is a cross-sectional view illustrating a state at the time of releasing engagement.

Hereinafter, Example 1 will be described with reference to drawings. FIG. 1 is a configuration view illustrating a locking structure according to an embodiment of the present invention. FIG. 2 is a cross-sectional view illustrating a state at the start of the engagement, FIG. 3 is a cross-sectional view illustrating a state in the middle of the engagement, FIG. 4 is a cross-sectional view illustrating a state immediately before engagement, FIG. 5 is a cross-sectional view illustrating a state at the end of the engagement, and FIG. 6 is a cross-sectional view illustrating a state at the time of releasing engagement.

<Configuration of Locking Structure 21>

In FIG. 1, a locking structure 21 is configured to include a locking protrusion 23 protruding from an article 22 (an example of a first article), and a locking arm 25 formed on another article 24 (an example of a second article) and engaged with the locking protrusion 23. The locking structure 21 is adopted as a structure for fixing another article 24 to the article 22. The locking structure 21 is disposed at a plurality of positions of the article 22 and the other article 24 (here, one of the plurality positions is described). Regarding the article 22 and the other article 24, an example is given in the description of Example 2.

In this specification, when the other article 24 is moved with respect to the article 22, the locking protrusion 23 and the locking arm 25 are engaged. However, conversely, it is also possible that the locking protrusion 23 and the locking arm 25 are engaged by moving the article 22 with respect to the other article 24.

<Locking Protrusion 23>

In FIG. 1, the locking protrusion 23 is formed in a portion where the downward movement of the other article 24 can be restricted when the locking arm 25 is engaged with the locking protrusion 23. The locking protrusion 23 is formed in a durable portion as compared with the locking protrusion 3 of the related art (see FIG. 11). The locking protrusion 23 includes a protrusion main body 26 and a jig groove 27 and is formed in the shape illustrated in the drawing.

<Protrusion Main Body 26>

In FIG. 1, the protrusion main body 26 is formed in a block-shaped protrusion portion protruding outward from the wall surface of the article 22. On the surface of the protrusion main body 26, a plurality of surfaces are disposed and formed. Specifically, an arm guide surface 28, a protruding tip surface 29, and an engaging surface 30 are disposed and formed along the engagement direction K (see FIG. 2) with the locking arm 25. On both sides, main body side surfaces 31 are disposed and formed, respectively. The engagement direction K is assumed to be a direction substantially coinciding with the direction of vibration of the article 22 and the other article 24.

The arm guide surface 28 is formed on a surface that is inclined from the wall surface of the article 22 toward the protruding tip surface 29. The arm guide surface 28 is formed on a surface against which the locking arm 25 first abuts, and on a sliding surface. The inclination angle is appropriately set. In Example 1, the arm guide surface 28 is formed on a gently inclined surface with a small angle. The arm guide surface 28 is formed to be continuous with the wall surface of the article 22 via a curved surface 32. The arm guide surface 28 is formed to be continuous with the protruding tip surface 29 via a curved surface 33.

The protruding tip surface 29 is formed on a surface positioned at the tip in the protruding direction of the protrusion main body 26. The protruding tip surface 29 is formed on a surface along the engagement direction K (see FIG. 2) and a surface parallel with the wall surface of the article 22. The protruding tip surface 29 is formed on a surface whose length in the engagement direction K is longer than the length of an arm tip 42 (described later) in the engagement direction K (formed on a surface that is longer downward than the length of the arm tip 42 in the engaged state as illustrated in FIG. 5).

Figure 11:
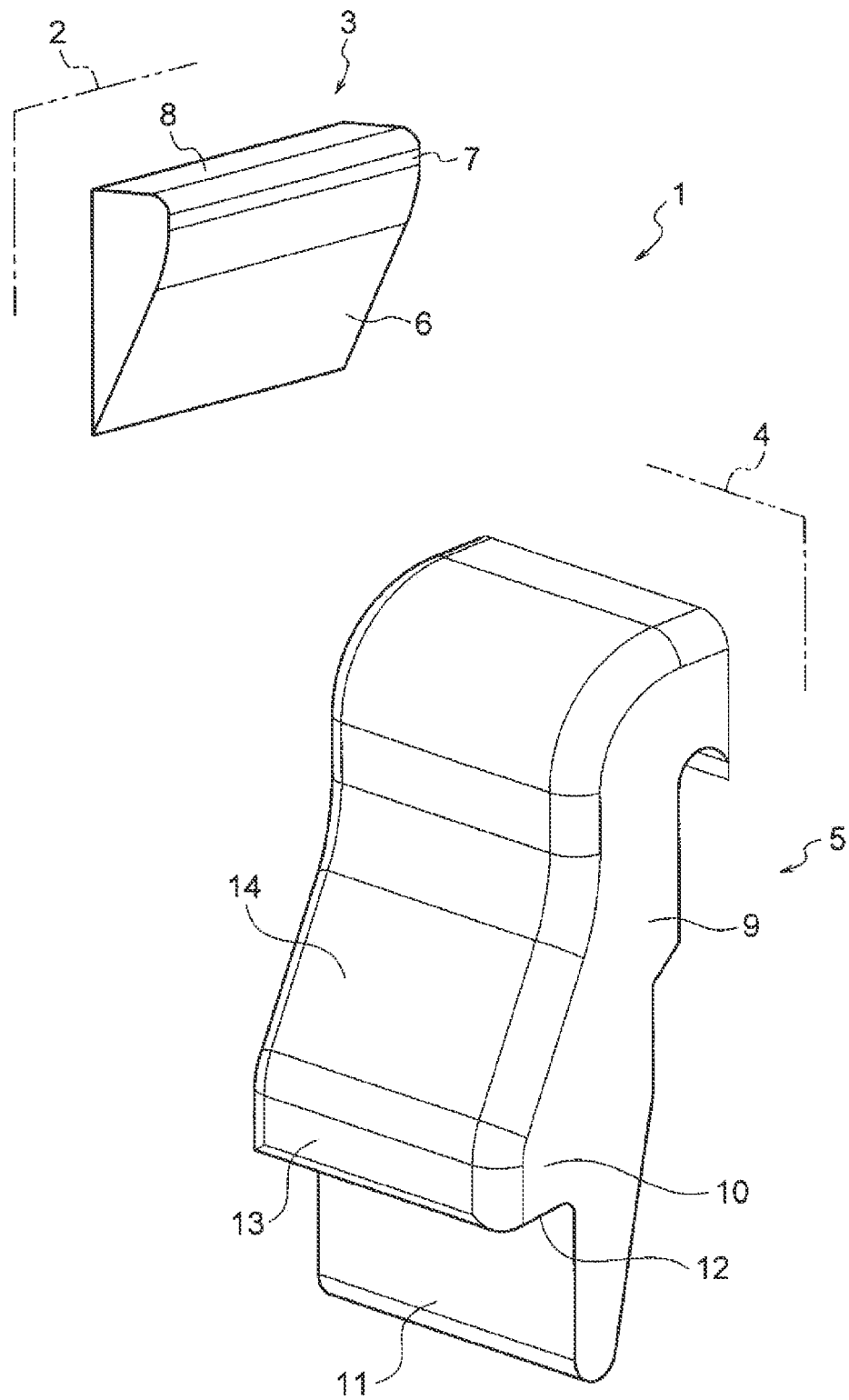
FIG. 11 is a configuration view illustrating a locking structure of an example in the related art.

If the protruding tip surface 29 is a long surface, the protrusion main body 26 is formed in a thickened portion which is longer in the engagement direction K than the locking protrusion 3 of the related art (see FIG. 11). In other words, even though the protrusion main body 26 is scraped off from the engaging surface 30 side due to factors such as vibration, the protrusion main body 26 is formed so that the function thereof can be maintained for a longer period than in the related art. The protrusion main body 26 is formed in a durable portion and a portion where the stably engaged state can be maintained.

The engaging surface 30 is formed on the uppermost surface of the protrusion main body 26. The engaging surface 30 is formed on a surface to be engaged with the locking arm 25 going over the protrusion main body 26. The engaging surface 30 is formed on a surface which an engaged surface 44 (described later) of the locking arm 25 faces. The engaging surface 30 is formed on a slightly inclined surface. In Example 1, as illustrated in FIG. 2, the engaging surface 30 is formed on an inclined surface that is at an acute angle with respect to the wall surface of the article 22 (assumed to be an example and may be a surface perpendicular to the wall surface of the article 22). The engaging surface 30 is formed to be continuous with the wall surface of the article 22 via a curved surface 34. In Example 1, the protrusion main body 26 is formed so that a continuous portion between the engaging surface 30 and the protruding tip surface 29 becomes an edge.

<Jig Groove 27>

In FIG. 1, the jig groove 27 is formed in a portion for guiding a jig 57 (or a minus screwdriver or the like) which will be described later. The jig groove 27 is disposed and formed at the center position in the width direction of the protrusion main body 26. The jig groove 27 is formed in a groove portion which cuts out the protrusion main body 26 in the engagement direction K (see FIG. 2) from the arm guide surface 28 to the protruding tip surface 29. The jig groove 27 is formed in a groove portion having a groove width of about one-third of the length in the width direction of the protrusion main body 26 (the groove width is assumed to be an example and may be matched with the size of the jig 57 which will be described later).

Figure 12:
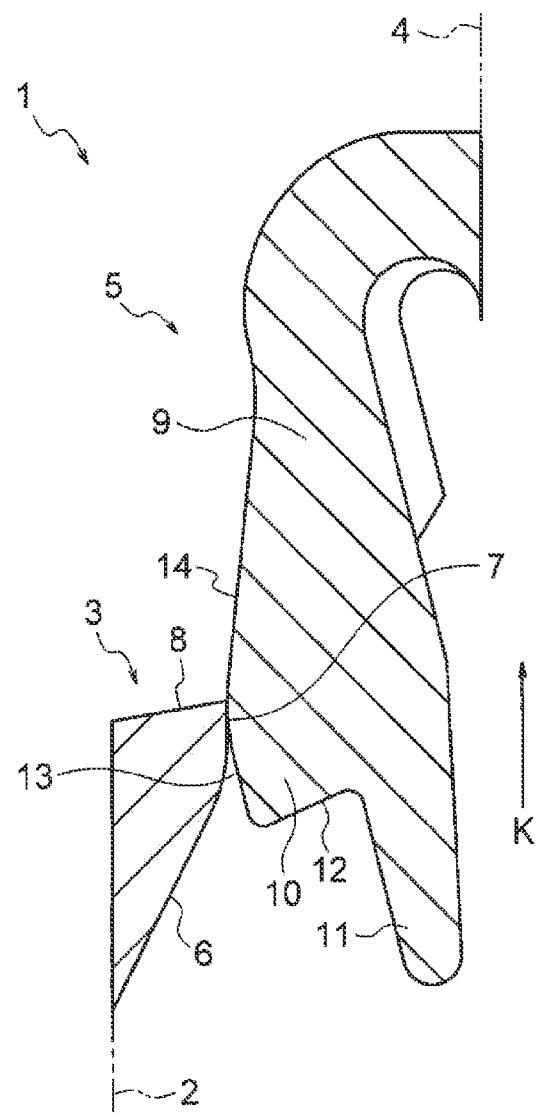
FIG. 12 is a cross-sectional view illustrating a state in the middle of engagement of the locking structure of the example in the related art.
Figure 13:
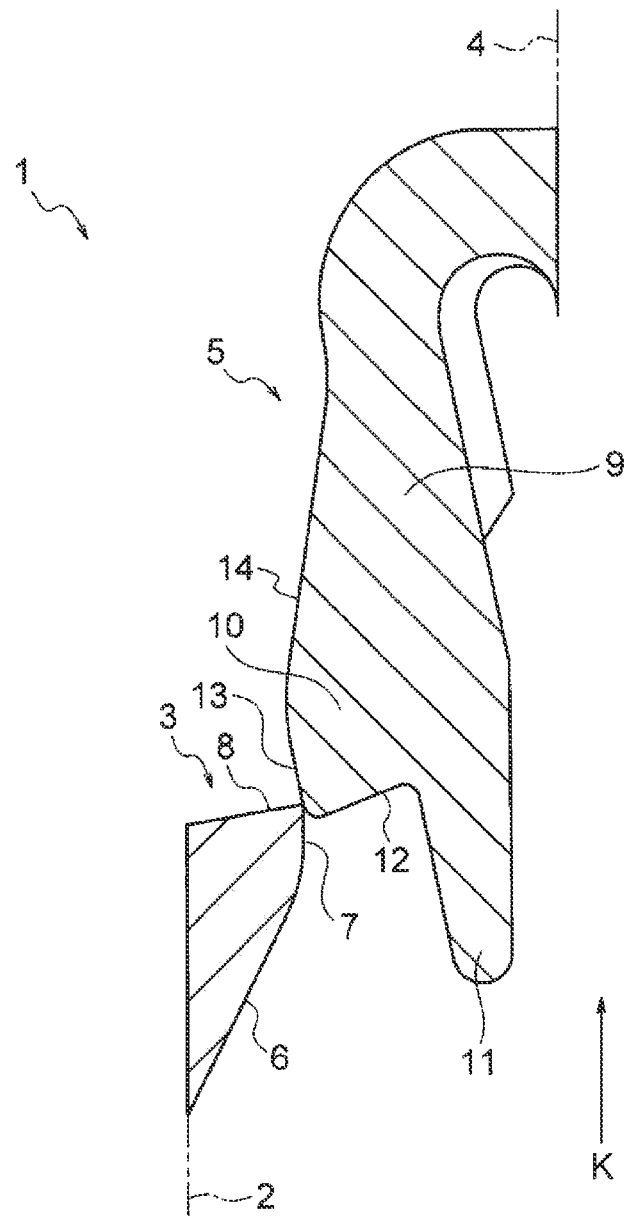
FIG. 13 is a cross-sectional view illustrating a state immediately before engagement of the locking structure of the example in the related art.
Figure 14:
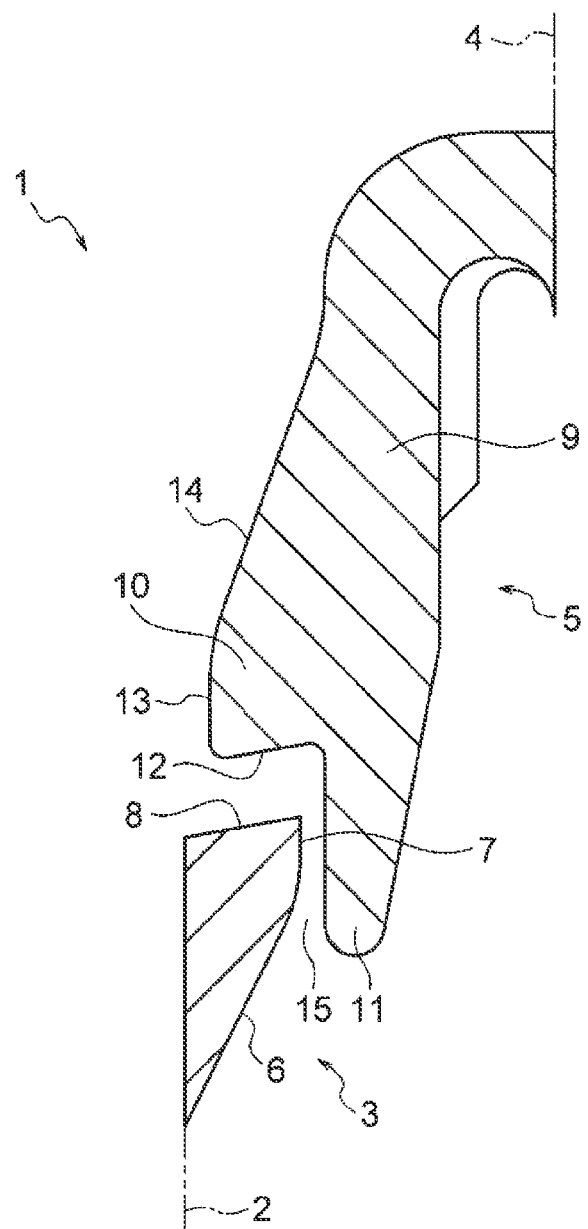
FIG. 14 is a cross-sectional view illustrating a state (engaged state) at the end of engagement of the locking structure of the example in the related art.

In the jig groove 27, a first groove bottom 35 and a second groove bottom 36 (bottom wall) are formed. A curved surface 37 connecting the first groove bottom 35 and the second groove bottom 36 and a curved surface 38 connecting the second groove bottom 36 and the protruding tip surface 29 are formed in the jig groove 27. The first groove bottom 35 is formed on the same surface as the wall surface of the article 22. The first groove bottom 35 is formed in a portion for initially guiding the jig 57 which will be described later. On the other hand, the second groove bottom 36 is formed in a tapered (inclined) groove bottom substantially parallel with the arm guide surface 28. The second groove bottom 36 is formed in a portion for guiding the jig 57 toward the arm tip 42 which will be described later. The second groove bottom 36 is disposed and formed at substantially the same position as the arm guide surface 6 (see FIGS. 11 and 12) of the locking protrusion 3 of the related art.

The jig groove 27 is formed so that a portion open to the protruding tip surface 29 faces an outer surface 50 of the arm tip 42 which will be described later. The jig groove 27 is formed to push the arm tip 42 by taking out the jig 57 which will be described later from a portion open to the protruding tip surface 29.

<Locking Arm 25>

In FIG. 1, the locking arm 25 is formed in a portion engaging with the locking protrusion 23. The locking arm 25 includes an arm main body 39 and an engaging projection portion 40 and is formed in the shape illustrated in the drawing. The locking arm 25 is formed basically in the same shape as the locking arm 5 (see FIG. 11) of the related art except for a transverse rib 48 which will be described later (assumed to be an example).

<Arm Main Body 39>

In FIG. 1, the arm main body 39 is formed in a cantilevered arm shape in which one end 41 is continuous with the wall surface of the other article 24. The arm main body 39 is formed in a flexible portion which is bent toward the wall surface of the other article 24. In the arm main body 39, the one end 41 is formed as a bending portion. The arm main body 39 is formed in a portion where the one end 41 protrudes outward slightly. The remaining portion is formed to extend downward in the drawing. At the other end of the arm main body 39 (at the free end), the arm tip 42 is formed. Reference numeral 43 in the arm main body 39 indicates a curved portion.

<Engaging Projection Portion 40>

In FIG. 1, the engaging projection portion 40 is formed in a portion protruding from the outer surface of the arm main body 39. Specifically, the engaging projection portion 40 is formed in a portion protruding from the position where the arm tip 42 of the arm main body 39 is left. The engaging projection portion 40 is formed in a portion to be directly engaged with the locking protrusion 23 (in other words, the engaging projection portion 40 is formed in the portion to be locked directly). On the surface of the engaging projection portion 40, a plurality of surfaces are disposed and formed. Specifically, the engaged surface 44, the protruding tip surface 45, and the guided surface 46 are formed along the engagement direction K (see FIG. 2) with the locking protrusion 23.

The engaged surface 44 is formed on a surface facing the engaging surface 30 of the locking protrusion 23. The engaged surface 44 is formed as an inclined surface that is inclined in accordance with the engaging surface 30 (assumed to be an example, and if the engaging surface 30 is at a right angle, the engaged surface 44 may be a right-angled surface in accordance therewith). The engaged surface 44 is formed to be continuous with the protruding tip surface 45 via a curved surface 47. On the engaged surface 44, the transverse rib 48 is formed. The transverse rib 48 is formed to extend straight along the width direction of the locking arm 25. The transverse rib 48 is formed to protrude slightly downward.

The formation of the transverse rib 48 is optional, but if there is the transverse rib 48, it is effective for absorbing rattling by narrowing the distance from the engaging surface 30. If the transverse rib 48 is provided, when the article 22 and the other article 24 receive vibration or the like, the transverse rib 48 is more likely to be scraped off before the protrusion main body 26 of the locking protrusion 23, thus it is effective to prolong the life of the protrusion main body 26.

The protruding tip surface 45 is formed on a surface positioned at the tip in the protruding direction of the engaging projection portion 40. The protruding tip surface 45 is formed on a surface along the engagement direction K (see FIG. 2) and a surface parallel with the wall surface of the other article 24. The protruding tip surface 45 is formed on a surface whose length in the engagement direction K is shorter than the protruding tip surface 29 of the locking protrusion 23. The protruding tip surface 45 is formed to be continuous with the guided surface 46 via a curved surface 49.

The guided surface 46 is formed on a surface that is inclined from the protruding tip surface 45 toward the curved portion 43 of the arm main body 39. The guided surface 46 is formed on a surface which first abuts against the arm guide surface 28 of the locking protrusion 23, and on a sliding surface.

<Arm Tip 42>

In FIG. 1, the arm tip 42 is formed at the other end (free end) of the arm main body 39. On the arm tip 42, the outer surface 50, an end portion 51, and an inner surface 52 are formed. A side surface 53 of the arm tip 42 is formed in the same plane with a side surface 54 of the arm main body 39. The outer surface 50 is formed on a surface parallel with the wall surface of the other article 24. The end portion 51 is formed in an arc-shaped portion. The inner surface 52 is formed on a surface that is inclined toward an inner surface 55 of the arm main body 39.

<Operation of Locking Structure 21>

Hereinafter, the operation of the locking structure 21 will be described with reference to FIGS. 2 to 6 (also see FIG. 1 as necessary).

In FIG. 2, when the locking arm 25 is moved along the engagement direction K of the arrow with respect to the locking protrusion 23, the guided surface 46 of the locking arm 25 abuts against the arm guide surface 28 of the locking protrusion 23. Then, when the locking arm 25 is further moved along the engagement direction K so that the guided surface 46 slides on the arm guide surface 28, the locking arm 25 is bent at this time.

When the locking arm 25 is further moved along the engagement direction K, the curved surface 49 (the curved surface 49 between the protruding tip surface 45 and the guided surface 46) of the locking arm 25 slides on the protruding tip surface 29 of the locking protrusion 23 as illustrated in FIG. 3. As illustrated in FIG. 4, the protruding tip surface 45 of the locking arm 25 slides on the edge (an edge which is a continuous portion of the engaging surface 30 and the protruding tip surface 29) of the locking protrusion 23. As may be understood from FIGS. 3 and 4, the locking arm 25 is bent so that the inner surface 52 of the arm tip 42 approaches the wall surface of the other article 24. Therefore, it is understood that it is difficult to make the length of the arm tip 42 longer than that of the related art.

When the locking arm 25 is further moved along the engagement direction K, as illustrated in FIGS. 4 and 5, the locking arm 25 goes over the locking protrusion 23 and elastically returns to the original state thereof. As a result, the locking arm 25 is engaged with the locking protrusion 23. When the engaged state of the locking protrusion 23 and the locking arm 25 (see FIG. 5) is formed, the downward movement of the other article 24 is restricted.

<Release of Engaged State>

In FIG. 6, in the case of trying to release the engaged state for some reason, if the locking arm 25 is moved in the bending direction, the engaged state can be released. Specifically, since a space 56 is formed between the arm tip 42 and the opening portion (a portion open to the protruding tip surface 29) of the jig groove 27, if the dedicated jig 57 (or minus screwdriver and the like) is inserted into the jig groove 27 to push the arm tip 42, and the locking arm 25 is moved in the bending direction, the engaged state can be released.

<Effects of Locking Structure 21>

As described above with reference to FIGS. 1 to 6, according to the locking structure 21 which is an embodiment of the present invention, since the protrusion main body 26 of the locking protrusion 23 has a thickened structure as compared with the structure of the related art, the durability can be improved by the thickened amount than the related art. Since the jig groove 27 is formed in the protrusion main body 26, it is possible to release the engaged state by using the jig 57, and even if the protrusion main body 26 is thickened, it is possible to easily release the engagement. That is, the easiness of releasing engagement can be maintained as in the case of the related art.

Since a taper (second groove bottom 36) for guiding the jig 57 toward the arm tip 42 is formed in the jig groove 27, the jig 57 can be smoothly guided. Therefore, workability at the time of releasing engagement can be improved.

Since the jig groove 27 is disposed and formed at the center position in the width direction of the protrusion main body 26 of the locking protrusion 23, even though vibration is applied to the article 22 and the other article 24 and the protrusion main body 26 is scraped off, the protrusion main body 26 is reliably engaged with the engaging projection portion 40 of the locking arm 25 at both end positions in the width direction, thereby contributing to maintaining a stably engaged state.

Example 2

Figure 7:
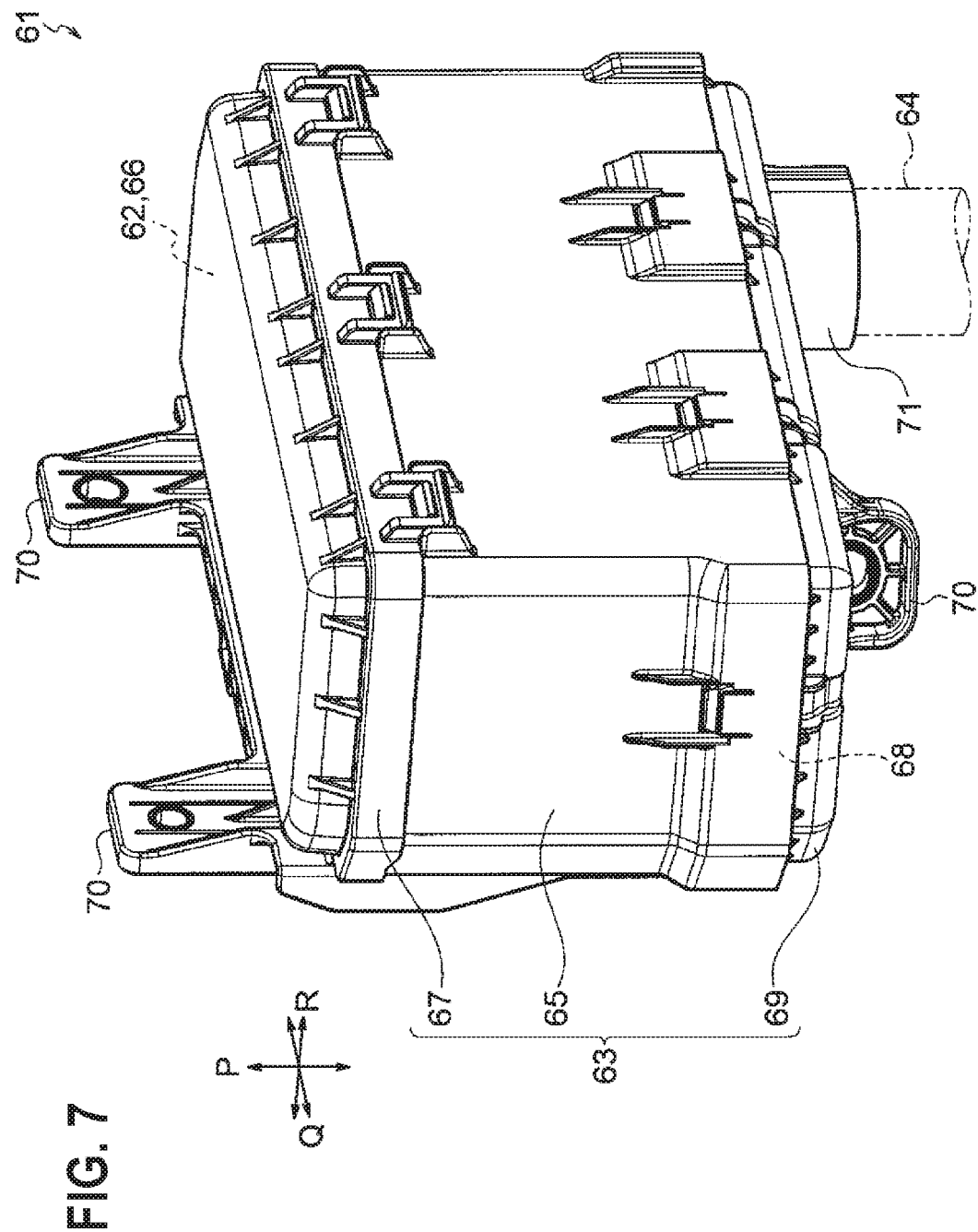
FIG. 7 is a perspective view illustrating an electrical connection box adopting the locking structure according to an embodiment of the present invention (Example 2)
Figure 8:
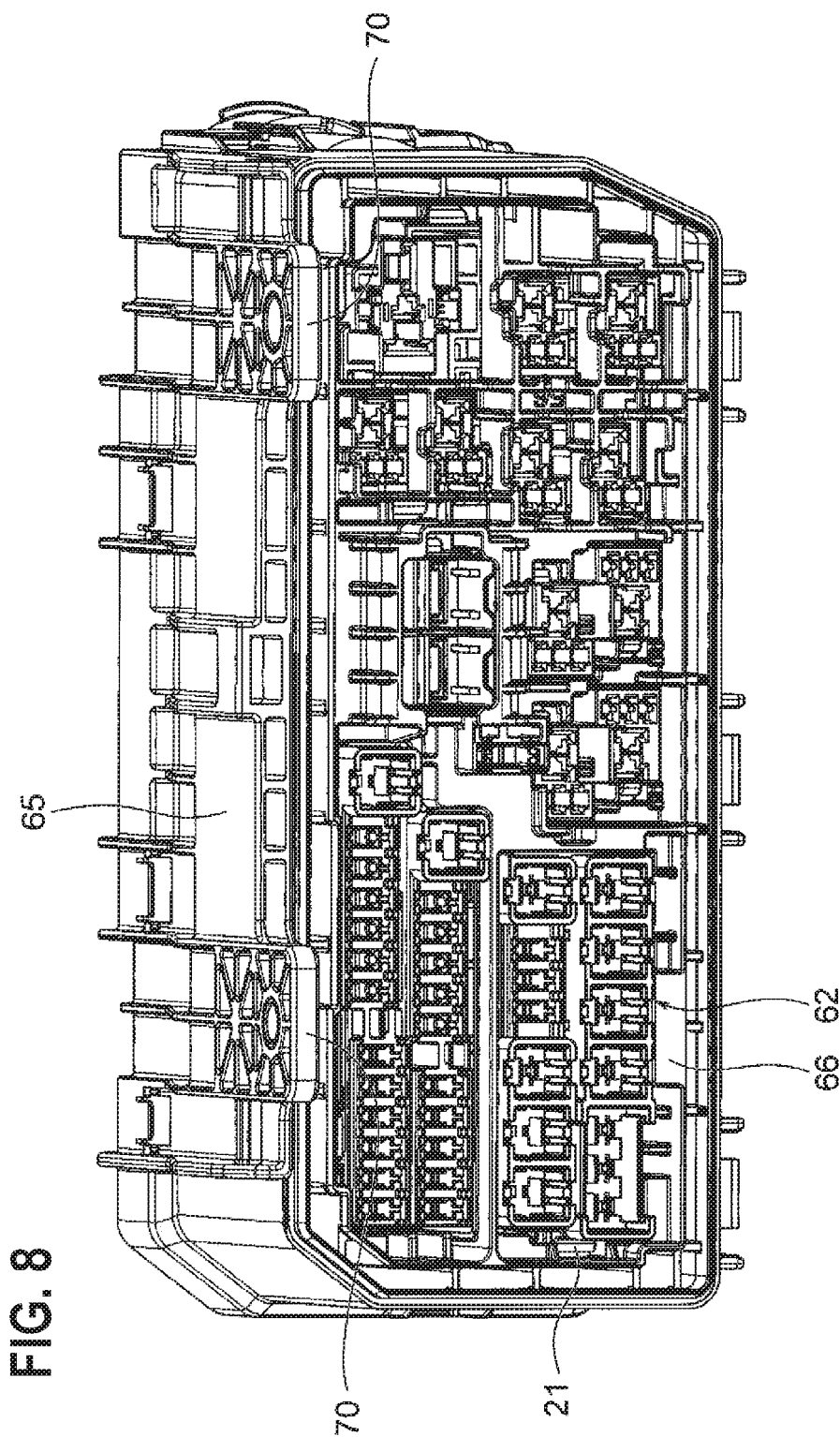
FIG. 8 is a perspective view illustrating a state of the electrical connection box as viewed from above the electronic component block.
Figure 9:
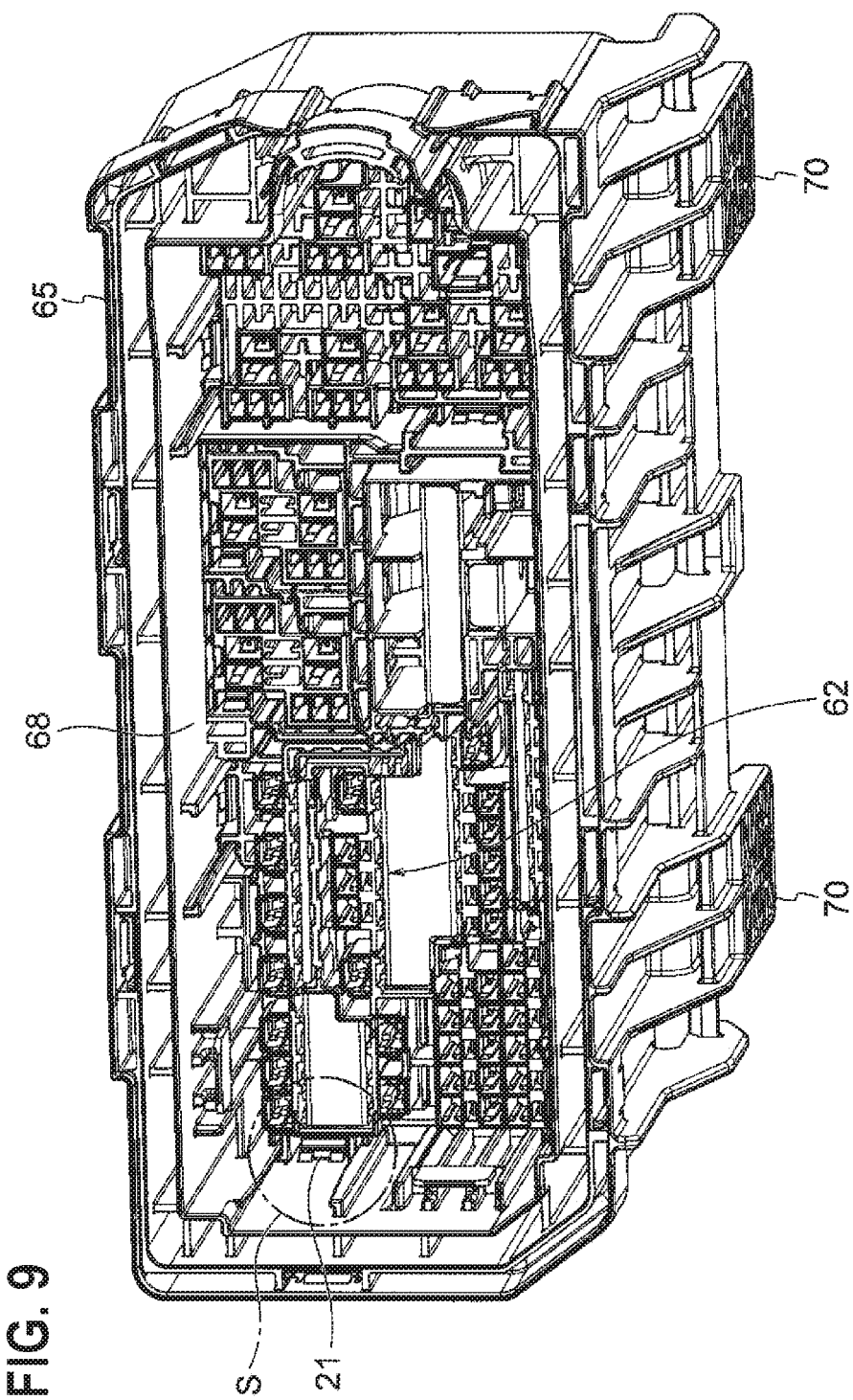
FIG. 9 is a perspective view illustrating a state of the electrical connection box as viewed from below the electronic component block.
Figure 10:
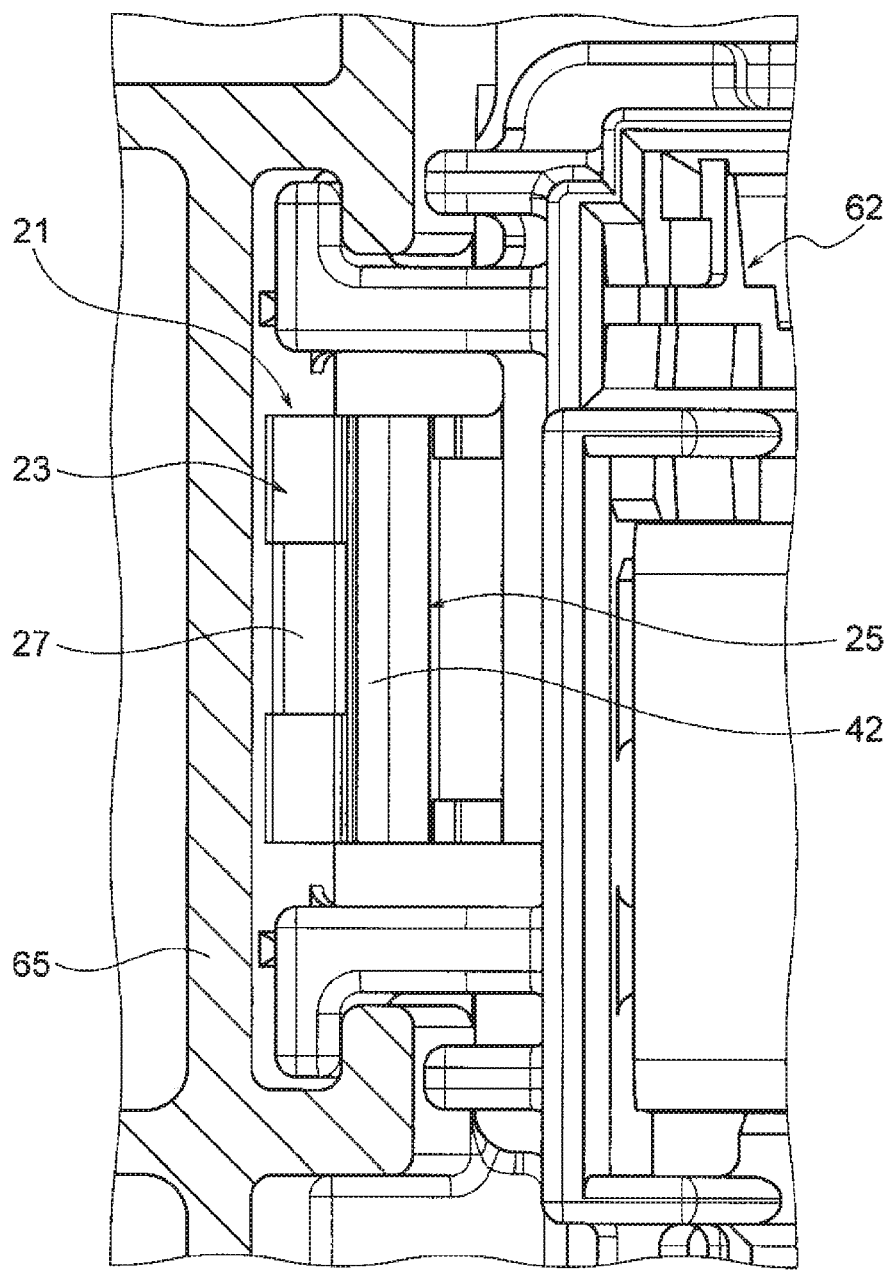
FIG. 10 is an enlarged view of a circle S in FIG. 9.

Hereinafter, Example 2 will be described with reference to drawings. FIG. 7 is a perspective view illustrating an electrical connection box adopting the locking structure according to an embodiment of the present invention. FIG. 8 is a perspective view illustrating the state of the electrical connection box as viewed from above the electronic component block, FIG. 9 is a perspective view illustrating a state of the electrical connection box as viewed from below the electronic component block, and FIG. 10 is an enlarged view of the circle S in FIG. 9. Components that are basically the same as those in Example 1 are denoted by the same reference numerals, and a detailed description thereof will be omitted. The arrow P in the drawing indicates a vertical direction, the arrow Q indicates a left-right direction, and the arrow R indicates a front-rear direction.

<Configuration of Electrical Connection Box 1>

In FIG. 7, an electrical connection box 61 is mounted on a truck in an exposed state to the outside (assumed to be an example). Specifically, the electrical connection box is mounted between a cabin and a loading platform in the truck (assumed to be an example). Such an electrical connection box 61 is configured to include an electronic component block 62 (corresponding to another article in claims, see FIGS. 8 and 9) and a housing 63 for housing the electronic component block 62. In the electrical connection box 61, an end portion of a wire harness 64 is disposed inside the housing 63, and the wire harness 64 is pulled out from the bottom. The wire harness 64 is provided with the electrical connection box 61 at a predetermined position of the end portion or the like and is wired to an automobile.

Although it will be understood in the following description, the electrical connection box 61 has the locking structure 21 of Example 1, and the same effects as those of Example 1 are obtained by the locking structure 21.

<Electronic Component Block 62>

In FIGS. 8 and 9, an electronic component block 62 is provided as a member to which a plurality of electronic components are assembled. The electronic component block 62 is provided as a member in which the electronic components are connected to a predetermined circuit. Specifically, the electronic component block 62 is provided as a member in which a relay is assembled to a relay assembling portion (reference numeral omitted) made of resin, and a fuse is assembled to a fuse assembling portion (reference numeral omitted) made of resin (the configuration of the electronic component block 62 is assumed to be an example).

The electronic component block 62 as described above is one of a cassette type and is detachably assembled to a frame 65, which will be described later, by the locking structure 21. For the electronic component block 62, this name may be read as a cassette block 62.

<Configuration of Housing 63>

In FIGS. 7 to 9, the housing 63 is a combination of members made of resin having insulation properties. Specifically, the housing 63 is configured to include the frame 65 to which the electric component block 62 is assembled (corresponding to articles in claims), an upper cover 67 for covering an upper opening portion 66 (see FIG. 8) of the frame 65, and a lower cover 69 for covering a lower opening portion 68 (see FIG. 9) of the frame 65. The housing 3 is provided with a pair of fixed leg portions 70 and a single fixed leg portion 70. A lead-out portion 71 from which the wire harness 64 is pulled out is provided in the housing 63.

<Locking Structure 21>

In FIG. 10, the locking structure 21 according to Example 2 is a portion for detachably assembling the electronic component block 62 with respect to the frame 65 and is configured to include the locking protrusion 23 on the side of the frame 65 and the locking arm 25 on the side of the electronic component block 62. The locking protrusion 23 is formed in a thickened portion as compared with the related art. The jig groove 27 for guiding the jig 57 (see FIG. 6) toward the arm tip 42 is formed in the locking protrusion 23.

In addition, it goes without saying that the present invention may be variously modified within a range not changing the scope of the present invention.

The invention claimed is:

1. A locking structure comprising:
a locking protrusion that protrudes from a first article; and
a locking arm that is formed on a second article and configured to be engaged with the locking protrusion in an engagement direction, the second article being different from the first article,
wherein the locking arm comprises a flexible arm main body and an engaging projection portion protruding from an outer surface of the arm main body,
wherein the locking protrusion comprises a protrusion main body on which an arm guide surface, a protruding tip surface, and an engaging surface are disposed along the engagement direction, and a jig groove that is formed in the protrusion main body,
wherein the engaging projection portion is formed on the outer surface at a position away from an arm tip of the arm main body in the engagement direction,
wherein the protruding tip surface is longer than the arm tip in the engagement direction, and
wherein the jig groove cuts out the protrusion main body in the engagement direction from the arm guide surface to the protruding tip surface.

2. The locking structure according to claim 1,
wherein the jig groove has a groove bottom having at least one of an inclined surface and a curved surface for guiding a jig toward the arm tip.

3. The locking structure according to claim 1,
wherein the jig groove is formed at a center position of the protrusion main body in a width direction.

4. The locking structure according to claim 1,
wherein the engagement direction substantially coinciding with a vibration direction of the first article and the second article.

5. An electrical connection box comprising:
an electronic component block to which a plurality of electronic components are assembled; and
a housing to which the electronic component block is assembled,
wherein the electronic component block is engaged with the housing by the locking structure according to claim 1.

6. A wire harness wired comprising:
the electrical connection box according to claim 5 provided at an end portion of the wire harness to be wired to an automobile.

\* \* \* \* \*